(12) United States Patent
Lin et al.

(10) Patent No.: US 9,036,378 B2
(45) Date of Patent: May 19, 2015

(54) POWER CONVERSION SYSTEM WITH ADJUSTABLE FREQUENCY

(71) Applicant: INNO-TECH CO., LTD., Taipei City (TW)

(72) Inventors: Ching-Yuan Lin, Taipei City (TW); Shu-Chia Lin, Taipei City (TW); Chih Feng Lin, Taipei City (TW)

(73) Assignee: INNO-TECH CO., LTD., Taipei (TW)

( * ) Notice: Subject to any disclaimer, the term of this patent is extended or adjusted under 35 U.S.C. 154(b) by 135 days.

(21) Appl. No.: 14/022,231

(22) Filed: Sep. 10, 2013

(65) Prior Publication Data

US 2014/0218975 A1  Aug. 7, 2014

(30) Foreign Application Priority Data

Feb. 4, 2013 (TW) .............................. 102104192 A

(51) Int. Cl.
*H02M 3/335* (2006.01)
*H02M 1/00* (2006.01)
*H02M 1/08* (2006.01)
*H02M 1/38* (2007.01)
*H03K 7/08* (2006.01)

(52) U.S. Cl.
CPC ............. *H03K 7/08* (2013.01); *H02M 3/33507* (2013.01); *H02M 1/08* (2013.01); *H02M 1/38* (2013.01)

(58) Field of Classification Search
CPC ................. H02M 3/33523; H02M 2001/0022; H02M 2001/0032
USPC ........................................ 363/21.01, 97, 98
See application file for complete search history.

(56) References Cited

U.S. PATENT DOCUMENTS

| | | | |
|---|---|---|---|
| 7,561,452 B2* | 7/2009 | Mednik et al. | 363/97 |
| 2007/0086219 A1* | 4/2007 | Yasumura | 363/21.02 |
| 2007/0201251 A1* | 8/2007 | Yasumura | 363/21.02 |
| 2010/0008109 A1* | 1/2010 | Morota | 363/21.16 |
| 2014/0078790 A1* | 3/2014 | Lin et al. | 363/21.16 |

* cited by examiner

*Primary Examiner* — Timothy J Dole
*Assistant Examiner* — Sisay G Tiku
(74) *Attorney, Agent, or Firm* — Lin & Associates IP, Inc.

(57) ABSTRACT

A power conversion system with adjustable frequency includes an electric transformer, a pulse width modulation driving controller, a switching transistor, a first and second voltage division resistors connected in series, an output diode and an output capacitor. The electric transformer receives the input power and generates the sensing current and induced current. The sensing current flows through the first and second voltage division resistors to generate the feedback signal. The induced current flows through the output diode and output capacitor to generate the output voltage to supply the load. The pulse width modulation driving controller determine whether the loading state of the load based on the feedback signal, and change the switching frequency according to the loading state and the input power, thereby increasing the whole efficiency of the power conversion system and achieving the aim of dynamically adjusting the optimal frequency.

9 Claims, 5 Drawing Sheets

POWER CONVERSION SYSTEM WITH ADJUSTABLE FREQUENCY

CROSS-REFERENCE TO RELATED APPLICATION

This application claims the priority of Taiwanese patent application No. 102104192, filed on Feb. 4, 2013, which is incorporated herewith by reference.

BACKGROUND OF THE INVENTION

1. Field of the Invention

The present invention generally relates to a power conversion system, and more specifically to a power conversion system dynamically adjusting the switching frequency of the pulse width modulation driving controller based on input voltage and loading status.

2. The Prior Arts

With remarkable advance in the electronic technologies, various electronic devices have been successfully promoted to the market. Since the electric appliances need sufficient electric power to operate, the manufacturers have constantly developed various power converters to meet the different requirements. For example, 110V AC (alternating current) city power is converted into 12V DC power to drive the DC motor, or 5V DC (direct current) power for providing the electronic devices, even 3.3V, 2.5V or 1.8V for the ICs (integrated circuits). Besides, it is sometimes needed to convert lower voltage power into higher voltage power, like the inverter. For instance, 12V DC power from the battery is converted into 110V or higher AC power.

One of common power converters is the switching power converter, which can be implemented in the buck converter, boost converter, buck-boost converter, forward converter, flyback converter, half bridge converter or full bridge converter. Especially, the flyback converter has the advantages of simple architecture, low cost and wide range of voltage regulation, and thus is widely used in the electronic devices with moderate or low power consumption.

The traditional flyback converter comprises Resonant, QR (Quasi-Resonant), Active Clamp types, and primarily employs aero voltage and/or zero current switching to achieve the aim of reducing switching loss due to switching elements (generally power transistors), thereby increasing the efficiency of power conversion.

For the above QR technology, the flyback converter operates in DCM (Discontinuous Conduction Mode) to effectively reduce the inductance so as to achieve aero voltage and/or zero current switching. Additionally, the QR technology may utilize the scheme of Valley Switching to improve the efficiency, and the variant frequency to suppress the EMI issue.

However, one of the primary shortcomings in the prior arts is that the QR flyback converter generally operates in DCM such that the peak current and the RMS (root-mean-square) current are considerable high, especially in heavy loading. As a result, the switching elements and the output diodes may generate higher conduction loss and turn-off switching loss, and the internal of the electric transformer generates higher ferric core loss, such that the efficiency of power conversion is greatly reduced. Therefore, it is not suitable for higher output power, such as more than 150W.

Additionally, as for EMI and power conversion efficiency, the industrial standard for the power-consuming electric appliances in the future is sure to be stricter. Therefore, it is greatly needed for a power conversion system with adjustable frequency, which reduces the EMI issue resulting from the switching appliance in the buck mode, removes the output jitter/ripple and greatly increases the efficiency of power conversion, thereby overcoming the above problems in the prior arts.

SUMMARY OF THE INVENTION

The primary objective of the present invention is to provide a power conversion system with adjustable frequency for converting an input power with an input voltage into an output power with an output voltage to supply an external load. The power conversion system of the present invention comprises an input power unit, first and second voltage division resistors, an electric transformer, a pulse width modulation (PWM) driving controller, a switching transistor, an output diode and an output capacitor. The electric transformer comprises a primary-side inductor, a primary-side sensing inductor and a secondary-side inductor coupled to each other. The input power is supplied to the primary-side inductor through the input power unit. The primary-side sensing inductor induces a sensing current flowing through the first and second voltage division resistors connected in series, and the secondary-side inductor induces an induced current for output, which flows through the output diode connected to the external load. The drain end of the switching transistor is coupled to the primary-side inductor, and the source end of the switching transistor is grounded through a ground resistor. The PWM driving controller controls the gate of the switching transistor according to the voltage of the connection point of the first and second voltage division resistors served as a feedback signal so as to adjust the switching frequency. As a result, the switching control is implemented by the scheme of the primary-side feedback, thereby improving the whole efficiency of power conversion.

The switching frequency of the PWM driving controller is lower when the loading state is lighter, and the switching frequency is higher when the loading state is heavier. The maximum switching frequency of the PWM driving controller is dynamically adjusted according to the input voltage of the input power. Substantially, the lower the input voltage is, the larger the maximum switching frequency is. Therefore, the efficiency of power conversion is increased, and the aim of dynamically adjusting the switching frequency is achieved.

BRIEF DESCRIPTION OF THE DRAWINGS

The present invention can be understood in more detail by reading the subsequent detailed description in conjunction with the examples and references made to the accompanying drawings, wherein.

DETAILED DESCRIPTION OF THE PREFERRED EMBODIMENTS

The present invention may be embodied in various forms and the details of the preferred embodiments of the present invention will be described in the subsequent content with reference to the accompanying drawings. The drawings (not to scale) show and depict only the preferred embodiments of the invention and shall not be considered as limitations to the scope of the present invention. Modifications of the shape of the present invention shall too be considered to be within the spirit of the present invention.

Figure 1:
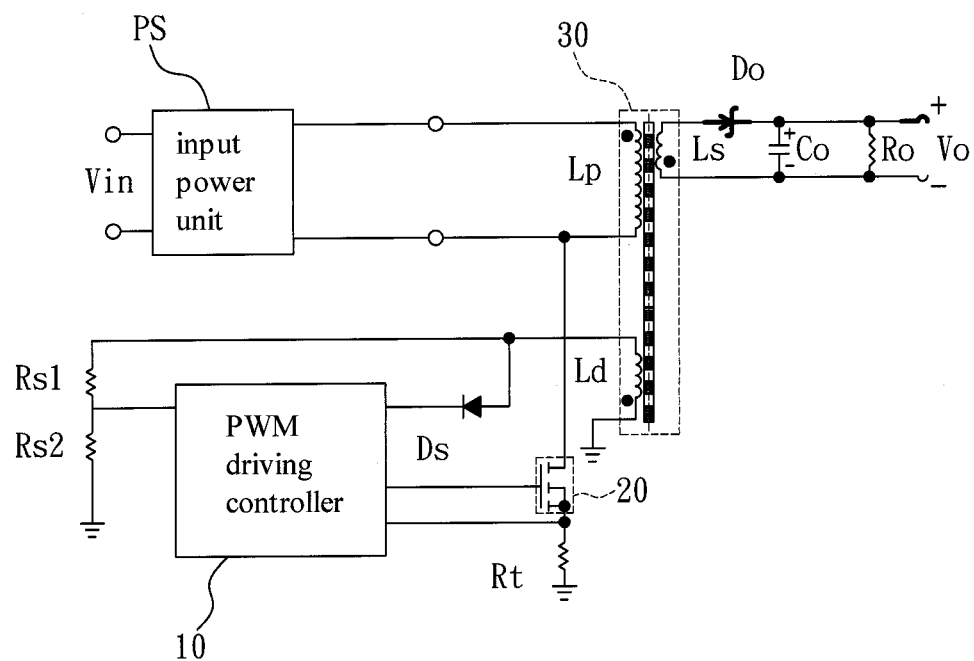
FIG. 1 is a view schematically showing a power conversion system with adjustable frequency according to the first embodiment of the present invention.

Please refer to FIG. 1 illustrating the power conversion system with adjustable frequency according to the first embodiment of the present invention. As shown in FIG. 1, the power conversion system with adjustable frequency of the first embodiment generally comprises the input power unit PS, the PWM (pulse width modulation) driving controller 10, the switching transistor 20, the electric transformer 30, the first and second voltage division resistors Rs1 and Rs2, the output diode Do and the output capacitor Co. The power conversion system is used to convert the input power with the input voltage Vin into the output power with the output voltage Vo supplying the external load Ro.

The input power unit PS is intended for filtering the input voltage Vin of the input power so as to generate the input filtered power.

The electric transformer 30 specifically comprises the primary-side inductor Lp, the primary-side sensing inductor Ld and a secondary-side inductor Ls, which are coupled to each other. The primary-side sensing inductor Ld and the secondary-side inductor Ls generate the sensing current and the induced current by induction, respectively. The primary-side inductor Lp is coupled to the input power unit PS to receive the input filtered power. One end of the secondary-side inductor Ls is connected to one end of the first voltage division resistor Rs1, another end of the first voltage division resistor Rs1 is connected to one end of the second voltage division resistor Rs2, and another end of the second voltage division resistor Rs2 is grounded. That is, the first voltage division resistor Rs1 and the second voltage division resistor Rs2 are connected in series.

The output diode Do and the output capacitor Co are connected in series. Additionally, the positive end of the output diode Do is coupled to one end of the secondary-side inductor Ls so as to conduct the induced current. The negative end of the output diode Do is coupled to one end of the output capacitor Co, and another end of the output capacitor Co and another end of the secondary-side inductor Ls are grounded. Meanwhile, the output capacitor Co and the external load Ro are connected in parallel such that the output voltage Vo is generated by the output capacitor Co.

Furthermore, the drain end of the switching transistor 20 is coupled to one end of the primary-side inductor Lp, and the source end of the switching transistor 20 is grounded via the ground resistor Rt. The PWM driving controller 10 at least has the switching output end and the sensing input end. Specifically, the switching output end is connected to the gate end of the switching transistor 20, and the sensing input end is connected to the connection point of the first and second voltage division resistor RS1 and Rs2 to receive the voltage division signal at the connection point, which is served as the feedback signal. Meanwhile, the PWM driving controller 10 performs the switching process to control the gate end of the switching transistor 20 based on the feedback signal, thereby controlling the efficiency of power conversion.

Figure 2:
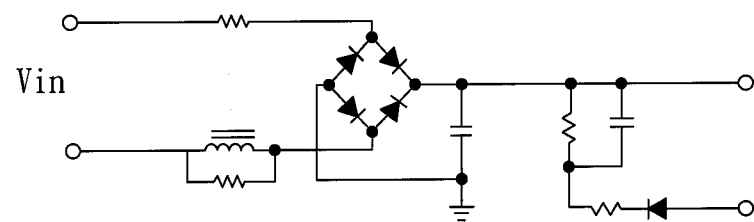
FIG. 2 is a view showing the power input unit according to the first embodiment of the present invention.

Refer to FIG. 2, illustrating the power input unit of the first embodiment. As shown in FIG. 2, the input power unit PS can be implemented by one of various traditional electrical units, such as diode bridge unit, filtering inductor, rectifying unit. Since the technology of the input power unit PS is not the feature of the present invention, the detailed description about the electrical operation is omitted hereinafter. However, it should be noted that the input power unit PS shown in FIG. 2 is only an illustrative example to describe the primary aspects of the present invention, and not intended to limit the scope of the present invention. That is, other electrical equivalent units are also included in the present invention.

More specifically, in the switching operation of the present invention, the PWM driving controller 10 can adjust the switching frequency of the PWM driving signal based on the variation of the input power and the loading state so as to increase the efficiency of power conversion. In other words, the switching operation of the PWM driving controller 10 comprises the step of determining the current loading state according to the feedback signal. The switching frequency is lower when the loading state becomes lighter, and the switching frequency is higher when the loading state is heavier. In particular, the switching frequency of the PWM driving controller 10 is the maximum switching frequency when the loading state reaches the preset threshold loading, and the maximum switching frequency is lower as the input voltage becomes higher.

Additionally, the present invention may operate in DCM when the loading is lighter, and in CCM (Continuous Conduction Mode) when the loading is heavier. However, it should be noted that the switching operation of the present invention is not limited herein, and is intended to perform DCM or CCM according to the actual requirement.

Figure 3:
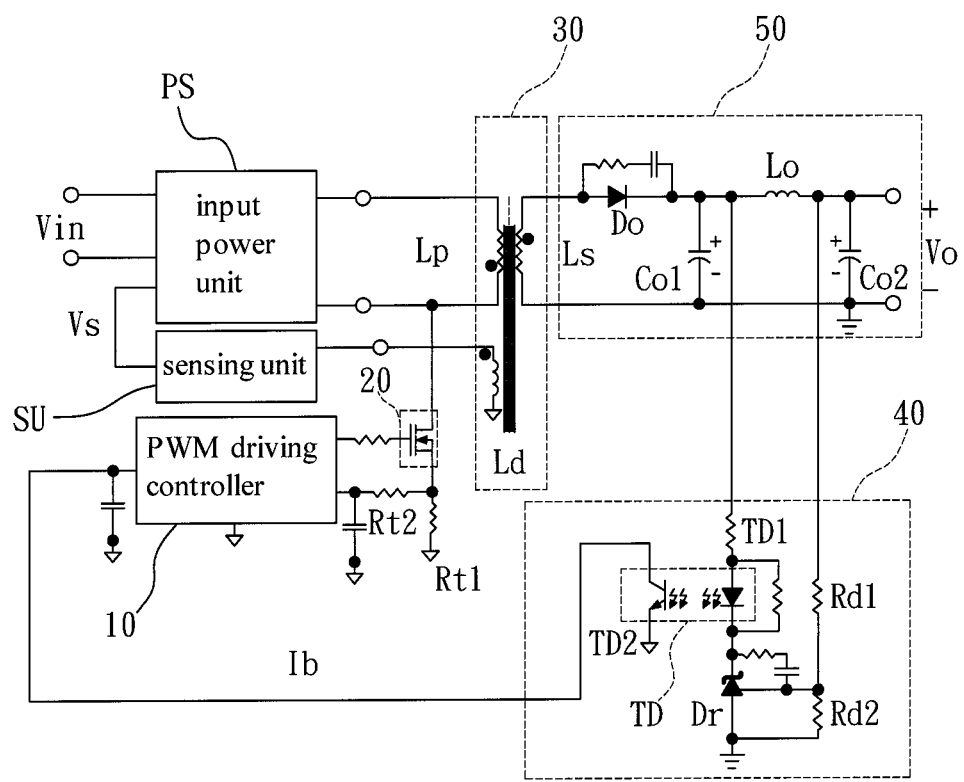
FIG. 3 is a view schematically showing a power conversion system with adjustable frequency according to the second embodiment of the present invention.

Refer to FIG. 3, showing the power conversion system with adjustable frequency according to the second embodiment of the present invention. It should be noted that the second embodiment of the present invention in FIG. 2 is similar to the first embodiment of the present invention in FIG. 1. The primary difference is that the power conversion system of the second embodiment is implemented by the secondary-side feedback, instead of the primary-side feedback used in the first embodiment. Therefore, the detailed description of the same components is omitted herein after.

As shown in FIG. 3, the power conversion system of the second embodiment comprises the input power unit PS, the sensing unit SU, the PWM driving controller 10, the electric transformer 30, the loading current detection unit 40 and the output unit 50. The power conversion system of the second embodiment converts the input power with the input voltage Vin into the output power with the output voltage Vo supplying the external load Ro. The loading current detection unit 40 is used as the secondary-side feedback unit to implement the feedback function through the secondary-side of the electric transformer 30.

Figure 4:
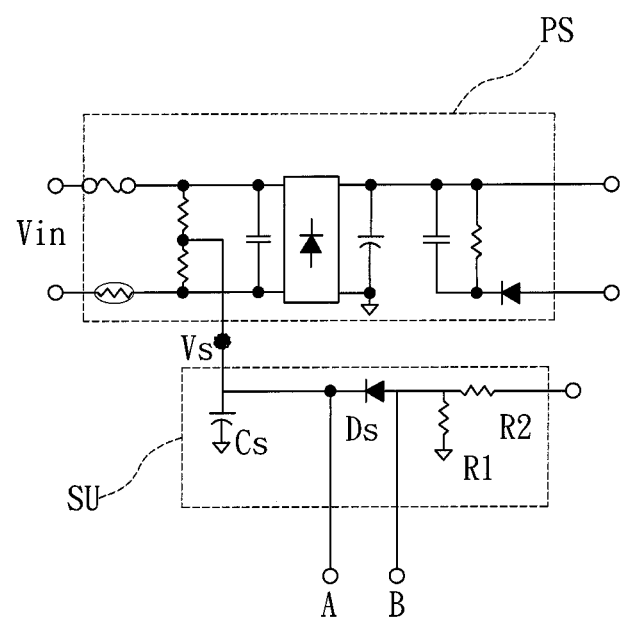
FIG. 4 is a view showing the power input unit and the sensing unit according to the first embodiment of the present invention.

The input power supply unit PS receives and electrically filters the input power to generate the input filtered power and the voltage division power Vs. The electric transformer 30 receives the input filtered power to perform power conversion, and the sensing unit SU receives the voltage division power Vs to generate two sensing signals. Ono of exemplary circuits of the input power supply unit PS and the sensing unit SU is shown in FIG. 4 for reference. However, it should be noted that the scope of the present invention is not limited by the description of the circuit in the FIG. 4, but covers all the electrical functions disclosed herein.

As shown in FIG. 4, the input power supply unit primarily PS employs two resistors to generate the voltage division power Vs, and the rectifying circuit is used to perform rectification so as to avoid any larger electrical variation in the input power Vin, which mat affect the subsequent processes. Specifically, the sensing unit SU comprises the sensing capacitor Cs, the sensing diode Ds, the first sensing resistor R1 and the second sensing resistor R2. One end of the sensing capacitor Cs is grounded, and another end of the sensing capacitor Cs receives the voltage division power Vs and is coupled to the negative end of the sensing diode Ds. One end of the first sensing resistor R1 is grounded, another end of the first sensing resistor R1 is coupled to one end of the second sensing resistor R2, and another end of the second sensing resistor R2 receives the sensing current from the electric transformer 30. The two sensing signals generated by the sensing unit SU are transferred to the negative and positive ends of the sensing diode Ds, respectively. That is, the two sensing signals come from the nodes A and B in FIG. 4, respectively.

The sensing unit SU may directly sense the magnitude, waveform and zero point of the input voltage Vin at the node A, such as the voltage of city power. Besides, the current flowing through the node B is used to indirectly sense the voltage of city power. The output voltage can also be sensed by the node B through the auxiliary coil of the electric transformer. It is further determined when the valley occurs in DCM, so as to perform the valley switching, and thus improving the efficiency.

Please return to FIG. 3. The electric transformer 30 is similar to that of the first embodiment, and also has the primary-side inductor Lp, the primary-side sensing inductor Ld and a secondary-side inductor Ls, which are coupled to each other. The primary-side sensing inductor Ld and the secondary-side inductor Ls generate the sensing current and the induced current by induction, respectively. The primary-side inductor Lp receives the input filtered power. One end of the primary-side sensing inductor Ld is grounded, and the sensing unit SU is coupled to another end of the primary-side sensing inductor Ld to receive the sensing current. Additionally, the secondary-side inductor Ls is coupled to the output unit 50 to receive the induced current and the output unit 50 generates the output voltage Vo.

More specifically, the output unit 50 may comprise the output diode Do, the first output capacitor Co1, the second output capacitor Co2 and the output inductor Lo. The positive end of the output diode Do is coupled to one end of the secondary-side inductor Ls, the negative end of the output diode Do is coupled to one end of the first output capacitor Co1 and one end of the output inductor Lo. Meanwhile, another end of the output inductor Lo is coupled to one end of the second output capacitor Co2. Another end of the first output capacitor Co1, another end of the second output capacitor Co2 and another end of the secondary-side inductor Ls are grounded. In particular, the two ends of the output inductor Lo are connected to the loading current detection unit 40 served as the secondary-side feedback unit, and the loading current detection unit 40 is further connected to the PWM driving controller 10 so as to form the secondary-side feedback loop.

The loading current detection unit 40 comprises the photo coupler TD, the first detection resistor Rd1, the second detection resistor Rd2 and the SCR (silicon control rectifier) Dr. The photo coupler TD consists of the detection LED TD1 and the detection transistor TD2. The emitter end of the photo coupler TD is grounded, and the positive end of the detection transistor TD2 is coupled to the negative end of the output diode Do of the output unit 50. The light emitted by the detection LED TD1 is incident onto the base end of the detection transistor TD2 so as to turn on the detection transistor TD2 and cause the collector end of the detection transistor TD2 to generate the loading current detection signal Ib, served as the feedback signal and further transferred to the PWM driving controller 10. Additionally, one end of the first detection resistor Rd1 is coupled to another end of the output inductor Lo of the output unit 50, another end of the first detection resistor Rd1 is coupled to one end of the second detection resistor Rd2, and another end of the second detection resistor Rd2 is grounded. The anode end of the SCR Dr is also grounded, and the cathode end of the SCR Dr is coupled to the negative end of the detection LED TD1. Meanwhile, the gate end of the SCR Dr is connected to another end of the first detection resistor Rd1.

Therefore, the primary operation of the loading current detection unit 40 is to employ the photo coupler TD to generate the corresponding loading current detection signal Ib based on the loading current in a manner of electrical isolation with photo coupling. At the same time, the SCR Dr is used to turn on or off the conduction path of the photo coupler TD according to the loading current, that is, to determine whether the photo coupler TD generates the loading current detection signal Ib.

The feedback signal in the above first and second embodiments of the present invention may have a linear or nonlinear relation with the input voltage Vin, or alternatively, the feedback signal and feedback signal are correlated or linked by a built-in lookup table.

The operation of the PWM driving controller 10 of the present embodiment is the same as that of the first embodiment in FIG. 1, and the detailed description is thus omitted herein. The PWM driving controller 10 can be implemented by MCU (microcontroller), CPU (central processing unit) or specific circuitry consisting of a plurality of discrete electronic elements.

Figure 5:
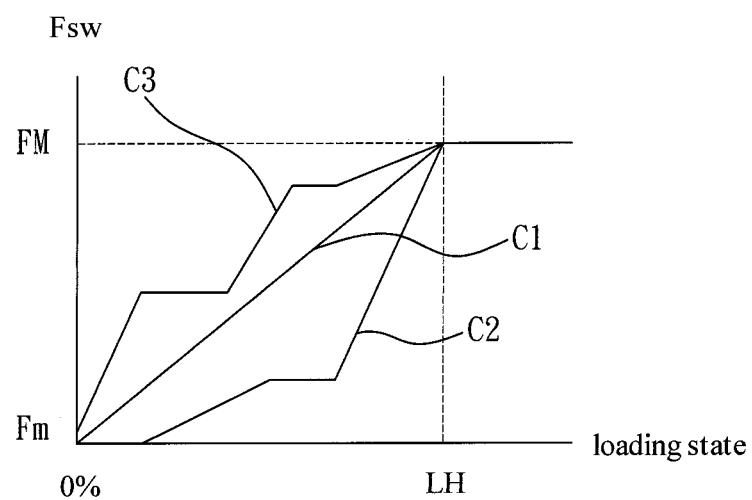
FIG. 5 is a view showing the relation between the switching frequency and the loading state according to the present invention.

Below is the detailed description about the key features of the switching operation of the PWM driving controller 10 with reference to FIGS. 5 and 6. FIG. 5 schematically illustrates the relation between the switching frequency and the loading state, and shows the relation between the maximum switching frequency and the input voltage. The loading state refers to the loading current or loading power of the external load Ro.

As shown in FIG. 5, for the first and second embodiments of the present invention shown in FIGS. 1 and 3, the switching frequency Fsw increases or keeps a constant value as the loading state becomes heavier. More specifically, the switching frequency Fsw is the minimum switching frequency Fm when the loading state is zero loading 0% (such as zero loading current), the switching frequency Fsw is the maximum switching frequency FM when the loading state reaches the preset threshold loading LH, and the switching frequency Fsw is kept the maximum switching frequency FM when the loading state is larger than the threshold loading LH. The threshold loading LH can be given by a value selected from a range of 70%~100% of the full loading, like 95% of the full loading. Therefore, the switching frequency Fsw is the maximum switching frequency FM when the loading state is equal to or larger than the threshold loading LH. For instance, as for the electric transformer 30 with the rating output power of 18 W, the full loading is meant that the consumption power of the external load Ro is 18 W, and the loading state for the consumption power larger than 18 W is thus called "overloading".

The switching frequency Fsw of the present invention may refer to various curves, such as the curves C1, C2 and C3 in FIG. 5. The curve C1 represents single linear relation, the curves C2 and C3 are piecewise linearity. However, it should be noted that the curves C1, C2 and C3 are only illustrative examples, and not intended to limit the scope of the present invention. That is, the switching frequency Fsw of the present invention is substantially any curve as long as the switching frequency Fsw increases or keeps at the constant value as the loading state becomes heavier.

Figure 6:
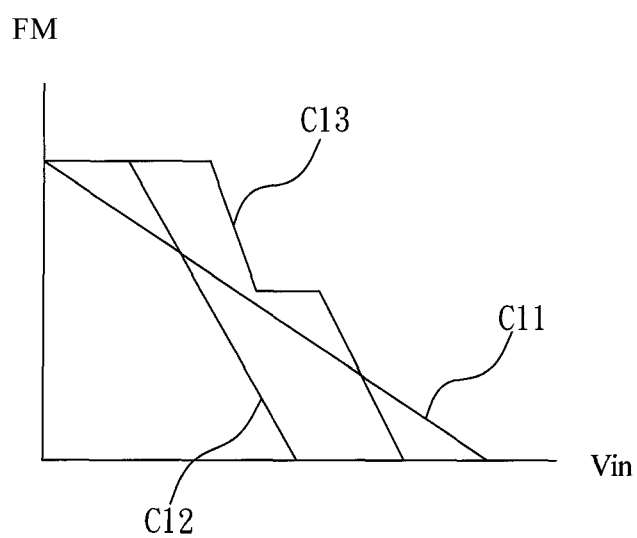
FIG. 6 is a view showing the relation between the maximum switching frequency and the input voltage according to the present invention.

Next, please refer to FIG. 6. The maximum switching frequency FM in FIG. 5 changes according to the input voltage Vin, like the curves C11, C12 and C13. For example, the curve C11 represents single linear decrease for the maximum switching frequency FM, and the curves C12 and C13 are piecewise linear decrease. However, it should be noted that the curves C11, C12 and C13 are only illustrative examples, and not intended to limit the scope of the present invention. That is, the maximum switching frequency FM is substantially any curve as long as the maximum switching frequency FM decreases or keeps at the constant value as the loading state becomes heavier. Therefore, a specific example can be given by the maximum switching frequency FM of 60 KHz to 150 KHz with respect to the input voltage Vin of 90 to 120V, or alternatively, the maximum switching frequency FM of 50K to 100 KHz for the input voltage Vin of 180 to 264V.

Furthermore, the PWM driving controller 10 may include the function of jitter to effectively decrease or suppress the issue of EMI.

Specifically, the input power can be the direct current from city power through the process of bridge rectification. For instance, city power is AC power of 85V to 270V and the input voltage Vin of the input power is AC 85V to 270V. The switching transistor 20 can be MOSFET (metal-oxide-semiconductor field effect transistor), and the loading current detection unit 40 is implemented by the circuitry consisting of at least one electrical passive element, wherein the electrical passive element may comprise a resistor or a capacitor.

From the above-mentioned, one aspect of the present invention is that the PWM driving controller can determine the loading state of the external load based on the feedback signal from the feedback loop, and adjust the switching frequency of the PWM signal to drive the switching transistor according to the loading state. In particular, the switching frequency is higher when the loading state is heavier, and the switching frequency is lower when the loading state is lighter, such that the efficiency of power conversion is improved and the aim of dynamical adjustment of the frequency is achieved.

Another aspect of the present invention is that the PWM driving controller can change the maximum switching frequency at full loading or overloading based on the input voltage. Especially, the maximum switching frequency is lower when the input voltage id higher, and the maximum switching frequency is higher when the input voltage id lower, so as to further improve the efficiency of power conversion for different input voltage, expand the application field and increase its industrial utility.

A yet one aspect of the present invention is that the user can set all the parameters in the power conversion system according to the actual needs, which are further saved in the PWM driving controller, and the PWM driving controller performs the process of power conversion so as to break through the limit of hardware, increase the versatility in use and indeed meet the various requirements of the application.

Although the present invention has been described with reference to the preferred embodiments, it will be understood that the invention is not limited to the details described thereof Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A power conversion system with adjustable frequency for converting an input power with an input voltage into an output power with an output voltage to supply an external load, the power conversion system with adjustable frequency comprising:

an input power supply unit for electrically filtering the input power to generate an input filtered power;

a first voltage division resistor;

a second voltage division resistor coupled to the first voltage division resistor in series, wherein an end of the second voltage division resistor is grounded and another end of the second voltage division resistor is coupled to an end of the first voltage division resistor;

an electric transformer comprising a primary-side inductor, a primary-side sensing inductor and a secondary-side inductor coupled to each other, wherein the primary-side inductor is connected to the input power supply unit, an end of the primary-side sensing inductor is grounded, another end of the primary-side sensing inductor is coupled to another end of the first voltage division resistor, the primary-side sensing inductor induces a sensing current flowing through the first and second voltage division resistors, and the secondary-side inductor induces an induced current;

a switching transistor having a drain terminal coupled to an end of the primary-side inductor and a source terminal grounded via a ground resistor;

a pulse width modulation (PWM) driving controller at least comprising a switching output end and a sensing input end, wherein the switching output end is connected to a gate end of the switching transistor, the sensing input end is connected to a connection point of the first and second voltage division resistors for receiving a voltage division signal of the connection point served as a feedback signal;

an output diode having a positive end coupled to an end of the secondary-side inductor for conducting the induced current; and an output capacitor having an end coupled to a negative end of the output diode, wherein another end of the output capacitor and another end of the secondary-side inductor are grounded, and the output capacitor is connected to the external load in parallel;

wherein the PWM driving controller determines a loading state of the external load according to the feedback signal, and generates a PWM driving signal with a switching frequency based on the loading state, the PWM driving signal is transferred to the gate of the switching transistor to drive the switching transistor, the switching frequency is higher or kept as a constant when the loading state is heavier, the switching frequency reaches a maximum switching frequency when the loading state reaches a threshold loading, the switching frequency is the maximum switching frequency when the loading state is larger than the threshold loading, the threshold loading is given by a value selected from a range of 70%~100% of a full loading, the maximum switching frequency is adjusted based on the input voltage, and the maximum switching frequency is lower or kept as a constant when the input voltage is higher.

2. The power conversion system as claimed in claim 1, wherein the input supply power is a DC (direct current) power generated by rectifying city power through a rectifying bridge, the city power is an AC (alternating current) Power with 85~270V, and the input voltage of the input supply power is AC 85V~270V;

the PWM driving controller is selected from a group consisting of a MCU (microcontroller), a central processing unit and a circuitry comprising a plurality of discrete electronic components;

the switching transistor comprises a MOSFET (metal-oxide-semiconductor field effect transistor); and the loading current detection unit is a photo coupler or a circuitry comprising at least one passive element, and the at least one passive element is a resistor or capacitor, and the maximum switching frequency is 60K~150 KHz when the input voltage is 90~132V, and the maximum switching frequency is 50K~100 KHz when the input voltage is 180~264V.

3. The power conversion system as claimed in claim 1, wherein the feedback signal and the output voltage are correlated by a linear or nonlinear relation.

4. The power conversion system as claimed in claim 1, wherein the feedback signal and the output voltage are correlated by a built-in lookup table.

5. A power conversion system with adjustable frequency for converting an input power with an input voltage into an output power with an output voltage to supply an external load, the power conversion system with adjustable frequency comprising:

an input power supply unit for electrically filtering the input power to generate an input filtered power and a voltage division power;

a sensing unit for receiving the voltage division power to generate two sensing signals;

an electric transformer comprising a primary-side inductor, a primary-side sensing inductor and a secondary-side inductor coupled to each other, wherein the primary-side inductor induces a sensing current, the secondary-side inductor induces an induced current, the primary-side inductor is connected to the input power supply unit for receiving the input filtered power, an end of the primary-side sensing inductor is grounded, and the sensing unit is coupled to another end of the primary-side sensing inductor for receiving the sensing current;

an output unit coupled to the secondary-side inductor for providing the output voltage;

a loading current detection unit coupled to the output unit for generating a loading current detection signal corresponding to a loading current of the external load served as a feedback signal;

a switching transistor having a drain terminal coupled to an end of the primary-side inductor and a source terminal grounded via a ground resistor; and a pulse width modulation (PWM) driving controller at least comprising a switching output end, two sensing input ends and a feedback input end, wherein the switching output end is connected to a gate end of the switching transistor, the two sensing input ends receive the two sensing signals of the sensing unit, respectively, and the feedback input end receives the feedback signal of the loading current detection unit;

wherein the PWM driving controller determines a loading state of the external load according to the feedback signal, and generates a PWM driving signal with a switching frequency based on the loading state, the PWM driving signal is transferred to the gate of the switching transistor to drive the switching transistor, the switching frequency is higher or kept as a constant when the loading state is heavier, the switching frequency reaches a maximum switching frequency when the loading state reaches a threshold loading, the switching frequency is the maximum switching frequency when the loading state is larger than the threshold loading, the threshold loading is given by a value selected from a range of 70%~100% of a full loading, the maximum switching frequency is adjusted based on the input voltage, and the maximum switching frequency is lower or kept as a constant when the input voltage is higher.

6. The power conversion system as claimed in claim 5, wherein the input supply power is a DC (direct current) power generated by rectifying city power through a rectifying bridge, the city power is an AC (alternating current) Power with 85~270V, and the input voltage of the input supply power is AC 85V~270V;

the PWM driving controller is selected from a group consisting of a MCU (microcontroller), a central processing unit and a circuitry comprising a plurality of discrete electronic components;

the switching transistor comprises a MOSFET (metal-oxide-semiconductor field effect transistor); and the loading current detection unit is a photo coupler or a circuitry comprising at least one passive element, and the at least one passive element is a resistor or capacitor, and the maximum switching frequency is 60K~150 KHz when the input voltage is 90~132V, and the maximum switching frequency is 50K~100 KHz when the input voltage is 180~264V.

7. The power conversion system as claimed in claim 5, wherein the feedback signal and the output voltage are correlated by a linear or nonlinear relation.

8. The power conversion system as claimed in claim 5, wherein the feedback signal and the output voltage are correlated by a built-in lookup table.

9. The power conversion system as claimed in claim 5, wherein the sensing unit comprises a sensing capacitor, a sensing diode, a first sensing resistor and a second sensing resistor, the sensing capacitor has an end grounded and another end coupled to a negative end of the sensing diode to receive the voltage division signal, an end of the first sensing resistor is grounded, another end of the first sensing resistor is coupled to an end of the second sensing resistor, another end of the second sensing resistor receives the sensing current, the two sensing signals are transferred to a positive and negative ends of the sensing diode, respectively, the output unit comprises an output diode, a first output capacitor, a second output capacitor and an output inductor, a positive end of the output diode is coupled to an end of the secondary-side inductor, a negative end of the output diode is coupled to an end of the first output capacitor and an end of the output inductor, another end of the output inductor is coupled an end of the second output capacitor, another end of the first output capacitor, another end of the second output capacitor and another end of the secondary-side inductor are grounded, the loading current detection unit comprises a photo coupler, a first detection resistor, a second detection resistor and a silicon control rectifier, the photo coupler comprises a detection transistor and a detection light emitting diode (LED), an emitter end of the detection transistor is grounded, a positive end of the detection LED is coupled to the negative end of the output diode, the detection LED generates light incident onto a base end of the detection transistor to turn on the detection transistor such that a collector end of the detection transistor generates the loading current detection signal, an end of the first detection resistor is coupled to the another end of the output inductor, another end of the first detection resistor is coupled to an end of the second detection resistor, another end of the second detection resistor is grounded, an anode end of the silicon control rectifier is grounded, a cathode end of the silicon control rectifier is coupled to a negative end of the detection LED, a gate end of the silicon control rectifier is coupled to the another end of the first detection resistor, the loading current detection unit is a circuitry comprising at least one passive element, and the at least one passive element is a resistor or capacitor.

* * * * *